United States Patent
Filippi, Jr. et al.

(10) Patent No.: US 6,603,321 B2
(45) Date of Patent: Aug. 5, 2003

(54) METHOD AND APPARATUS FOR ACCELERATED DETERMINATION OF ELECTROMIGRATION CHARACTERISTICS OF SEMICONDUCTOR WIRING

(75) Inventors: Ronald G. Filippi, Jr., Wappingers Falls, NY (US); Alvin W. Strong, Essex Junction, VT (US); Timothy D. Sullivan, Underhill, VT (US); Deborah Tibel, South Burlington, VT (US); Michael Ruprecht, Essex Junction, VT (US); Carole Graas, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/999,719

(22) Filed: Oct. 26, 2001

(65) Prior Publication Data

US 2003/0080761 A1 May 1, 2003

(51) Int. Cl.$^7$ .............................................. G01R 31/26
(52) U.S. Cl. ....................................................... 324/719
(58) Field of Search .......................... 257/48, 467, 713; 324/719, 720, 721, 722

(56) References Cited

U.S. PATENT DOCUMENTS

| | | | | |
|---|---|---|---|---|
| 5,264,377 A | | 11/1993 | Chesire et al. ................. | 438/11 |
| 5,477,082 A | * | 12/1995 | Buckley et al. .............. | 257/679 |
| 5,497,076 A | * | 3/1996 | Kuo et al. ................. | 324/158.1 |
| 5,514,974 A | | 5/1996 | Bouldin ........................ | 324/763 |
| 5,801,394 A | | 9/1998 | Isobe ........................... | 257/48 |
| 5,874,777 A | * | 2/1999 | Ohmi et al. ................. | 257/758 |
| 5,900,735 A | | 5/1999 | Yamamoto ................... | 324/537 |
| 5,930,587 A | | 7/1999 | Ryan ............................. | 438/14 |
| 6,069,070 A | * | 5/2000 | Labunov et al. ............. | 438/635 |
| 6,091,080 A | | 7/2000 | Usui ............................ | 257/48 |
| 6,147,361 A | | 11/2000 | Lin et al. ..................... | 257/48 |

FOREIGN PATENT DOCUMENTS

| | | |
|---|---|---|
| JP | 9074121 | 3/1997 |
| JP | 11214628 | 8/1999 |
| JP | 11260878 | 9/1999 |

OTHER PUBLICATIONS

Tom C. Lee, Deborah Tibel, Timothy D. Sullivan, and Sheri Forhan, "Comparison of Isothermal, Constant Current and SWEAT Wafer Level EM Testing Methods,".

Deborah Tibel, Timothy D. Sullivan, "Comparison of Via/Line Package Level Vs. Wafer Level Results".

* cited by examiner

Primary Examiner—Safet Metjahic
Assistant Examiner—Etienne P LeRoux
(74) Attorney, Agent, or Firm—Steven Capella; Cantor Colburn LLP

(57) ABSTRACT

A method for determining the electromigration characteristics of a wiring structure in an integrated circuit device is disclosed. In an exemplary embodiment of the invention, the method includes configuring a defined test structure type for the integrated circuit device. The defined test structure type further includes a first line of wiring primarily disposed in a principal plane of a semiconductor substrate, and a second line of wiring connected to the first line of wiring. The second line of wiring is disposed in a secondary plane which is substantially parallel to the principal plane, with the first and second lines of wiring being connected by a via structure therebetween. A thermal coefficient of resistance for the first line of wiring and the via structure is determined, and a wafer-level stress condition is introduced in a first individual test structure of the defined test structure type. Then, at least one parameter value for is determined for the first individual test structure, which parameter value is used to predict a lifetime projection for the wiring structure in the integrated circuit device.

26 Claims, 7 Drawing Sheets

METHOD AND APPARATUS FOR ACCELERATED DETERMINATION OF ELECTROMIGRATION CHARACTERISTICS OF SEMICONDUCTOR WIRING

BACKGROUND

The present invention relates generally to the manufacture and testing of integrated circuit devices and, more particularly, to a method and apparatus for determining the electromigration characteristics of integrated circuit interconnect material.

Integrated circuits are typically fabricated with multiple levels of patterned metallization lines, electrically separated from one another by interlayer dielectrics containing vias at selected locations to provide electrical connections between levels of the patterned metallization lines. As these integrated circuits are scaled to smaller dimensions in a continual effort to provide increased density and performance (e.g., by increasing device speed and providing greater circuit functionality within a given area chip), the interconnect linewidth dimension becomes increasingly narrow, which in turn renders them more susceptible to deleterious effects such as electromigration.

Electromigration is a term referring to the phenomenon of mass transport of metallic atoms (e.g., aluminum) which make up the interconnect material, as a result of electrical current conduction therethrough. More specifically, the electron current collides with the metal ions, thereby pushing them in the direction of current travel. Over an extended period of time, the vacated atoms tend to cause void formations typically at one end of a line, whereas the accumulation of atoms at the other end of the line tend to cause hillock formations. Such deformation increases line resistance and, in some instances, leads to open circuits, short circuits and device failure. This phenomenon becomes increasingly more significant in integrated circuit design, as relative current densities through metallization lines continue to increase as the linewidth dimensions shrink.

Package-level testing is generally used in industry to evaluate the electromigration (EM) reliability of metal interconnects. For this purpose, standard test structures and test methodologies have been defined and implemented. These package-level tests are typically performed under moderately accelerated stress with expensive, specialized equipment and at elevated temperatures produced in an oven. Based on collected time to failure data, the lifetimes under field conditions are then estimated by using Black's equation for determining the acceleration factor in the EM tests.

However, as integrated circuit technology evolves, the interconnect systems therein become more complicated, which results in an increasing number of process modules to be evaluated for reliability assurance. Competitive pressures have correspondingly increased the need to shorten EM testing times (which are typically on the order of 10 to 100 hours for package-level testing). Accordingly, in order to reduce test time, wafer-level testing has been implemented as an alternative to package level testing.

Wafer-level testing is usually conducted using a probe station, and produces reduced fail times on the order of seconds to minutes. In so doing, the wafer tests involve introducing high current densities on the order of about $1 \times 10^7$ A/cm$^2$. Another significant difference between wafer-level testing and package-level testing is the fact that, in wafer-level testing, the elevated temperature conditions are created by Joule heating (from the applied stress current) and not through external oven heating.

One example of a wafer-level test technique is what is known as the "SWEAT" (Standard Wafer-level Electromigration Acceleration Test), in which a relatively large current is passed through a metal test structure. With this particular test, it is desired to maintain a constant "time to failure" from test to test. Other types of wafer-level tests include an isothermal (constant temperature) test and a constant current test. Unfortunately, the rapidity with which these wafer-level tests are performed, combined with the uncertainty of temperature associated with Joule heating, effectively limits the test's usefulness to being a "spot check" for monitoring the quality of wafer lots in real time. In other words, because of the difficulty with independently controlling temperature and current in wafer-level testing, lifetime projections produced by these methods are untrustworthy.

Another drawback associated with some conventional wafer-level testing is that the test structures themselves are typically fabricated with a single level of metal. However, such single-level metal structures are not representative of actual structures found on a product chip. In particular, they do not incorporate interlevel connections such as studs or vias, and thus are not suited for determining lifetime projections of structures on chips. Moreover, structures incorporating studs and vias can suffer from additional temperature non-uniformity due to selective heating of the line caused by geometric effects or materials differences.

BRIEF SUMMARY

The foregoing discussed drawbacks and deficiencies of the prior art are overcome or alleviated by a method for determining the electromigration characteristics of a wiring structure in an integrated circuit device. In an exemplary embodiment of the invention, the method includes configuring a defined test structure type for the integrated circuit device. The defined test structure type further includes a first line of wiring primarily disposed in a principal plane of a semiconductor substrate, and a second line of wiring connected to the first line of wiring. The second line of wiring is disposed in a secondary plane which is substantially parallel to the principal plane, with the first and second lines of wiring being connected by a via structure therebetween. A thermal coefficient of resistance for the first line of wiring and the via structure is determined, and a wafer-level stress condition is introduced in a first individual test structure of the defined test structure type. Then, at least one parameter value is determined for the first individual test structure, which parameter value is used to predict a lifetime projection for the wiring structure in the integrated circuit device.

In a preferred embodiment, a package-level stress condition is introduced in a second individual test structure of the defined test structure type. At least one parameter value for the second individual test structure is determined, and the at least one parameter value determined for the second individual test structure is correlated with the at least one parameter value determined for the first individual test structure.

In another embodiment, the defined test structure type includes a first line of wiring disposed in a principal plane of a semiconductor substrate. A second line of wiring is connected to the first line of wiring, the second line of wiring disposed in a secondary plane which is substantially parallel to the principal plane. In addition, a heat sink structure is located adjacent to the first line of wiring, the heat sink structure being capable of dissipating heat associated with passage of electrical current through the first line of wiring. Preferably, the first line of wiring includes a first end connected to a second end through an elongated section therebetween. The second line of wiring is connected to the first line of wiring at the first and second ends through metallic studs or vias.

BRIEF DESCRIPTION OF THE DRAWINGS

Referring to the exemplary drawings wherein like elements are numbered alike in the several Figures.

DETAILED DESCRIPTION

Figure 1:
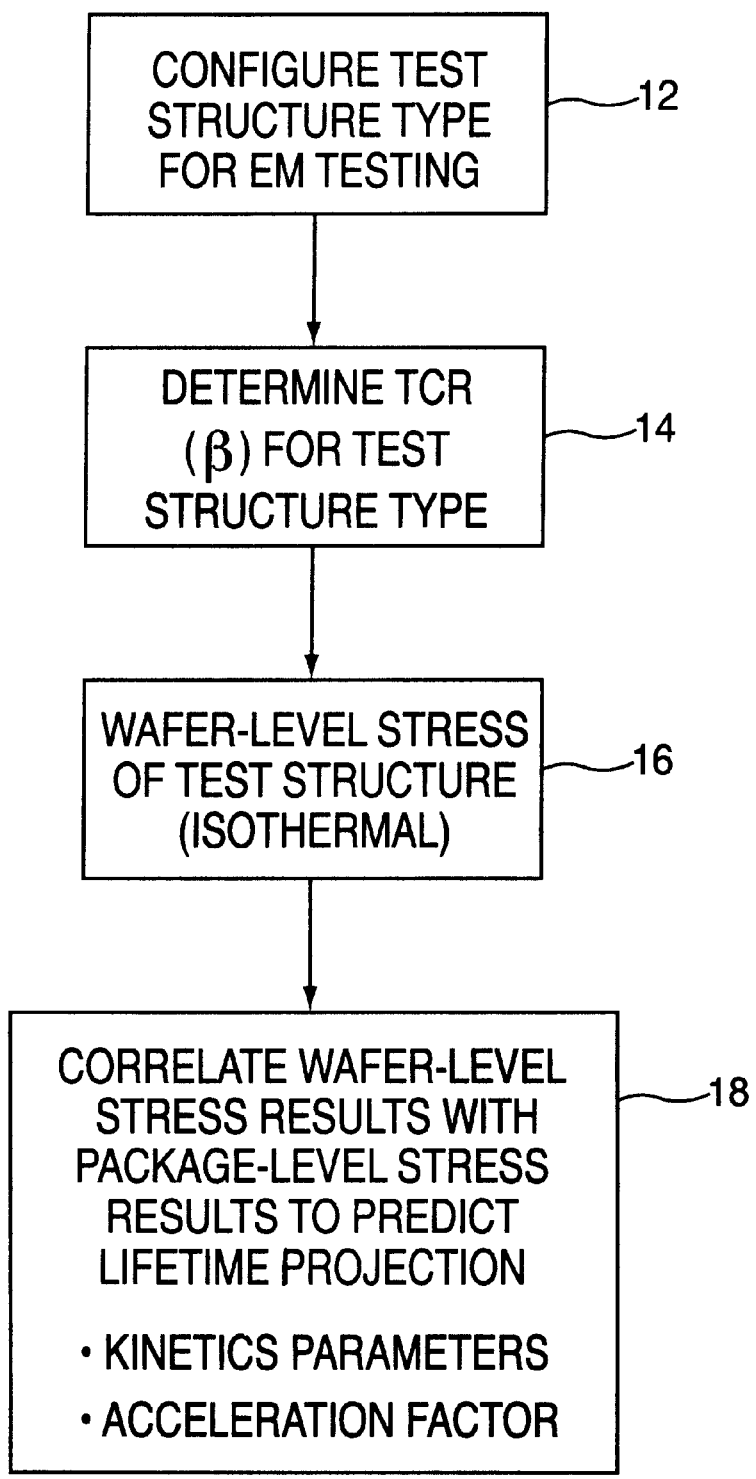
FIG. 1 is a block diagram illustrating a method for determining the electromigration characteristics of a wiring structure in an integrated circuit device, in accordance with an embodiment of the invention.

Referring initially to FIG. 1, there is shown a block diagram illustrating a method 10 for determining the electromigration characteristics of a wiring structure in an integrated circuit device, in accordance with an embodiment of the invention. Method 10 begins at block 12 with the configuration a test structure type for use in EM testing. The test structure type will be used in an initial set of package-level stress tests to determine a modeling parameter. Package-level stressing involves a set of stresses generally lasting about 48 hours in duration. Thereafter, shorter wafer-level stressing (on the order of about 100 seconds) may be implemented, with the data obtained from the initial package-level testing and from the wafer-level testing being correlated to predict an actual lifetime projection for a subject IC wiring structure.

Figure 2:
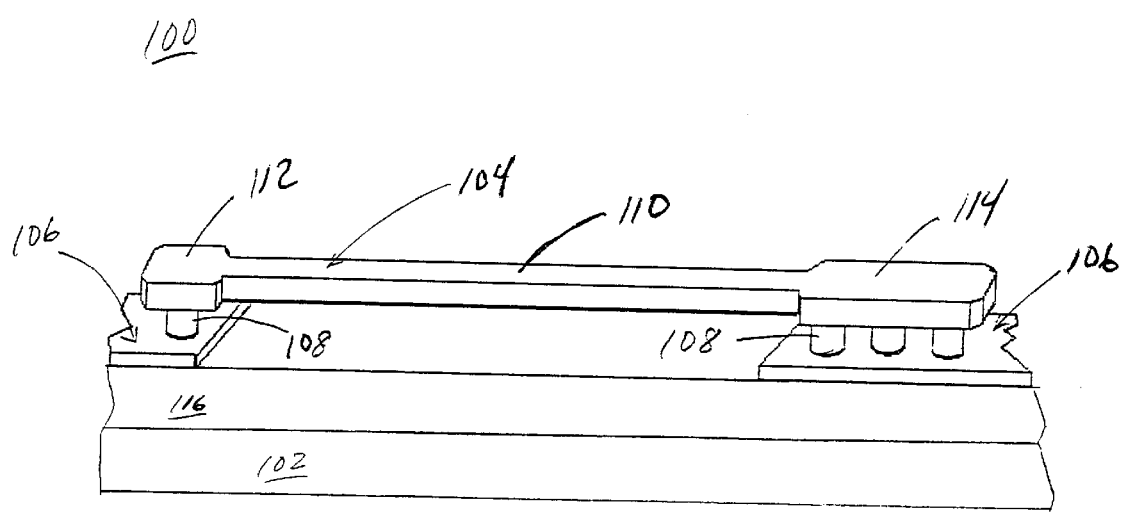
FIG. 2 is a perspective view of one possible test structure type which may be used in the method illustrated in FIG. 1.

The particular test structure type used in method 10 is shown in FIG. 2. In this particular embodiment, a test structure 100 formed upon a semiconductor substrate 102 includes a first line 104 of wiring connected to a second line 106 of wiring through a plurality of metallic studs 108 located at the ends of the first line 104. The first line 104 is made from a metal, such as aluminum or an alloy of aluminum and copper, and has an elongated section 110 connecting and extending between a first end 112 and a second end 114 thereof. The first and second ends 112, 114, having the studs 108 connected thereto, are wider than the elongated section 110 therebetween. In addition, first line 104 of wiring is disposed within a principal plane that is substantially parallel to a secondary plane in which the second line 106 of wiring is located.

The second line 106 of wiring is preferably a refractory metal, such as tungsten, and is used to connect the first line 104 to an input test current source (not shown). Second line 106 is further shown formed atop an insulative dielectric layer 116 which, in turn, is formed upon silicon substrate 102. Another layer of dielectric (not shown) will also surround studs 108 and separate metallization layers, such as the layers including first line 104 and second line 106. It should be noted, however, that second line 106 could alternatively be located on a wiring level that is above first line 104. As one examplar of a specific test structure type used in EM stress testing, a 0.21 $\mu$m wide, 300 $\mu$m long first line 104 was terminated at the first end 112 by a single tungsten stud 108 and at the second end 114 by three tungsten studs 108.

Figure 3:
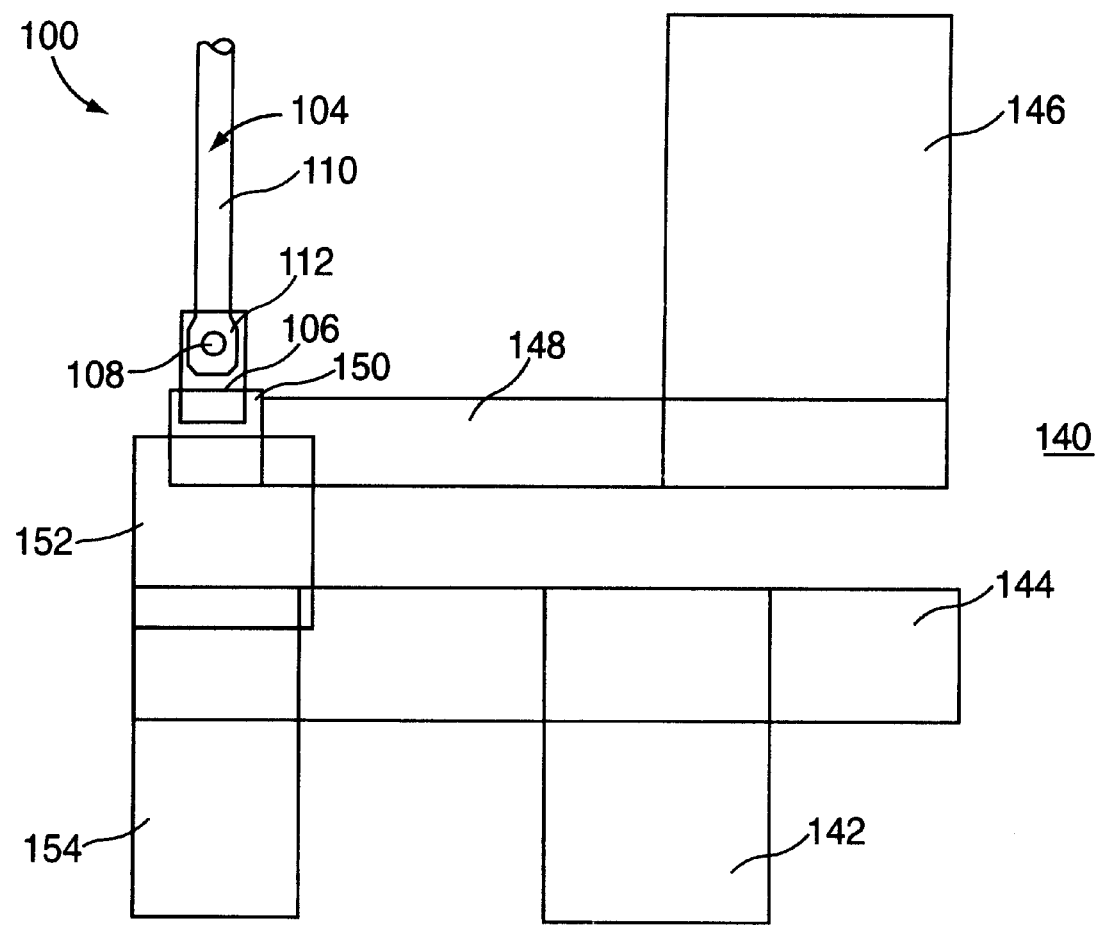
FIG. 3 is a top view of the test structure type of FIG. 2, additionally illustrating a feed structure for externally supplying test current thereto and sensing various measured parameters therefrom.

An exemplar feed structure 140 used in connection with exemplar test structure 100 is shown in FIG. 3. In the embodiment shown, feed structure 140 is formed at the same metallization level as is the second line 106 of wiring. A first pad connection 142 receives contact from an outside current source (e.g., an electrode) for application to the test structure. The first pad connection 142, in turn, is connected to a feed line 144 which provides a feed current path from the outside current source (not shown) to the test structure 100. In addition, a second pad connection 146 is provided for contact to an external measuring device (e.g., a multimeter) for measuring a desired parameter of the test structure. Similarly, a sense line 148 provides a conductive path between the second pad connection 146 and second line 106 of wiring at first interconnect pad 150. As can further be seen, the feed line 144 is also coupled to second line 106 of wiring through a second connection pad 152 connected directly to first connection pad 150.

The feed structure 140 further includes a heat sink 154 associated with feed line 144 and second connection pad 152. As is explained in further detail later, the overall heat sink capacity of a test structure (or actual wiring structures of ICs) is significant in the determination of the electromigration properties thereof.

Figure 4:
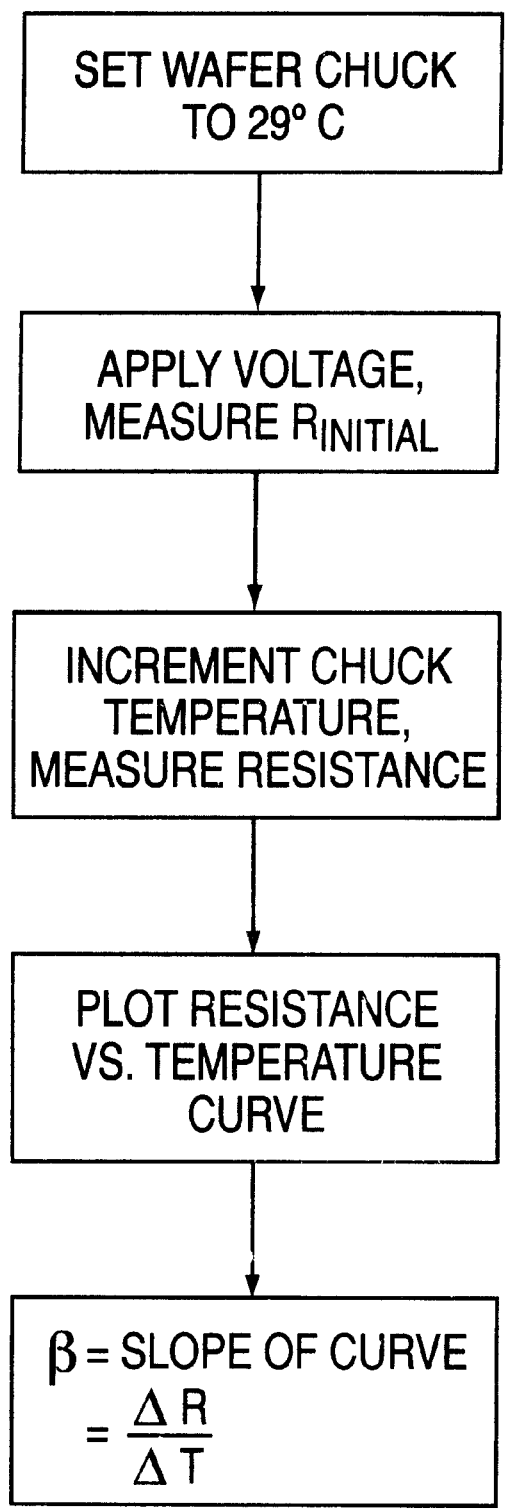
FIG. 4 is a flowchart illustrating the steps used in determining a thermal coefficient of resistance as shown in FIG. 1.

Referring again to FIG. 1, once the test structure type is configured, method 10 proceeds to block 14 to determine a thermal coefficient of resistance (TCR), or $\beta$, for the test structure 100. The value of the TCR will be used in conjunction with the isothermal type of wafer-level stressing, which will be described in further detail later. Generally speaking, the TCR is used to correlate a change in resistance versus a change in temperature for a given structure. Since the isothermal stress test uses a constant temperature for the test structure (and since this is generally the most straightforward and inexpensive way of directly measuring the temperature of the test structure) a measured resistance value is used to determine the temperature. A detailed procedure for determining $\beta$ for the test structure 100 is illustrated in FIG. 4.

First, the wafer containing test structure 100 is set upon a chuck which is set to an initial temperature that is preferably slightly above room temperature for better temperature stability (e.g., 29° C.). At the initial temperature, an initial resistance of the test structure 100 is measured by applying a voltage thereto and measuring the resulting current. However, the applied voltage should be small enough so as not to create any significant joule heating within the structure. Once the initial resistance is measured, these steps are repeated at increasing temperature intervals to about 100° C. At each temperature interval, the wafer should be given sufficient time to stabilize at the specific temperature created. In addition, the resistance at each temperature should be measured several times with the applied voltage in both the forward and reverse polarities.

An average resistance for each temperature interval is determined and a resistance vs. temperature curve may then be plotted using this data. The TCR, $\beta$, is determined by the slope of the curve, and should be very linear, wherein $\beta=\Delta$ in resistance/$\Delta$ in temperature. Accordingly, the determined value of $\beta$, along with the initial resistance and temperature values are then used in the isothermal wafer-level stress tests. Another measurement performed in this step is a temperature versus power curve in order to determine the thermal resistance ($R_\theta$) of the test structure type. Similar to the resistance versus temperature curve, the thermal resistance is determined by the slope of the temperature versus power curve, since $P=I^2R$. A linear behavior also exists between the temperature of the line and the applied power thereto.

Figure 5:
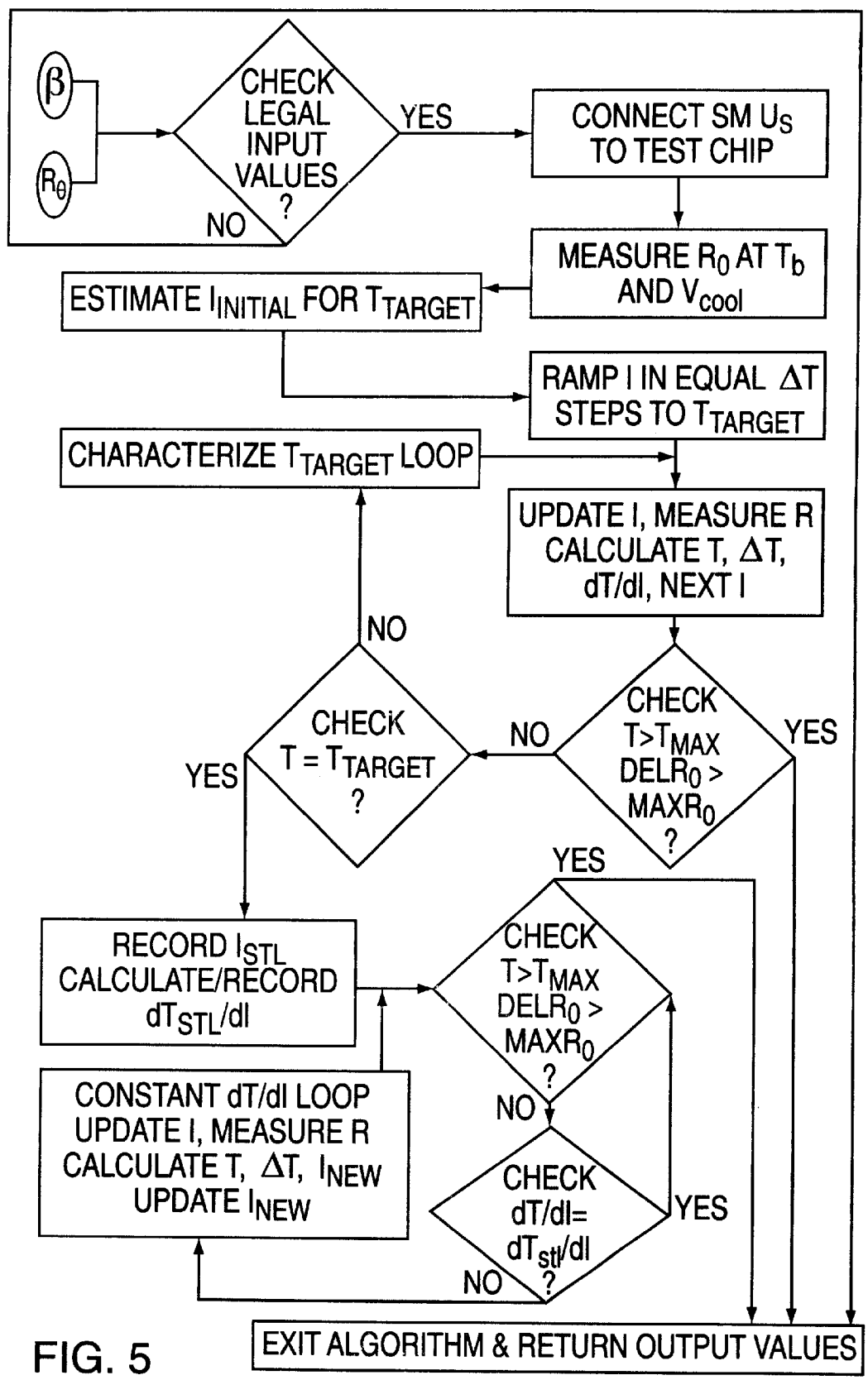
FIG. 5 is a flowchart illustrating an algorithm for the isothermal wafer-level stress described in FIG. 1.

As seen in FIG. 1, after the TCR ($\beta$) and the thermal resistance ($R_\theta$) for the test structure type have been determined, method 10 proceeds to block 16 for the isothermal wafer-level stressing of an individual test structure. A preferred algorithm for the isothermal stressing is outlined in FIG. 5. Initially, $\beta$ and $R_\theta$ are checked to see if they represent valid inputs. If so, the stress current may then be applied to the test structure.

As was the case during the determination of the TCR, an initial resistance $R_0$ of the specific structure to be stressed is determined by raising the temperature of the wafer chuck to about 29° C. (where the chuck temperature remains during the entire stress test), and applying a low (non-heating) voltage thereto. The value of the initial resistance $R_0$ (measured at an initial structure temperature) is used with the TCR to indirectly monitor the structure temperature through measured resistance.

Because of the nature of the isothermal type of wafer-level stress, a target structure temperature $T_{TARGET}$ is selected for the stress. In order to heat the structure up to $T_{TARGET}$ through Joule heating, an accurate estimate of the initial current $I_0$ is made (using Ohm's Law, the TCR, $R_0$ and $T_{TARGET}$). Then, the applied current is slowly incremented or "ramped up" in relatively equal temperature steps until $T_{TARGET}$ is reached. This is done so as to avoid a temperature overshoot and thus an overstress of the structure. An exemplary time interval between each successive current ramping step is about 140 ms.

Once the value of the applied stress current is brought up to $I_0$ (and presumably the actual Joule temperature of the structure equals $T_{TARGET}$), the resistance of the structure is monitored, and the results therefrom are introduced into a feedback path to adjust the applied current if a change is detected. The feedback path characterizes $T_{TARGET}$ by updating the current, measuring the resistance, as well as calculating the temperature, $\Delta T$, $dT/dI$, and the next value of current. Each change in current follows a waiting time of about 250 ms to account for small temperature drifts which might otherwise result in over correction and instability in the system.

The isothermal stress continues until an exit criterion is reached, such as a predetermined shift in structure resistance or structure failure. In the present embodiment, the exit criteria is set at a 100% change in resistance. A maximum test time could also be established to exit the loop as well. At the end of the isothermal stress, the time to fail is recorded, along with the specific change in resistance and the particular fail mode (e.g., increased resistance, open circuit, etc.). Additional details regarding an isothermal wafer-level stress test may be found in Comparison of Isothermal, Constant Current and SWEAT Wafer Level EM Testing Methods, Tom C. Lee, et al (IRPS Proceedings, 2001, p. 172–183), which is incorporated herein by reference.

Returning once again to FIG. 1, after isothermal stress testing, method 10 finally proceeds to block 18 for correlation of data obtained in the wafer-level stress test(s) with data obtained from a package-level stress test. Again, the package-level stress test is used to obtain EM modeling parameters and is done at elevated temperatures over a longer period of time than the wafer-level stress tests. Two sets of exemplary package-level stress conditions which may be applied to the test structure 100 in FIG. 2 include (1) a temperature of about 200° C. and a current density of about 23.3 mA/$\mu$m$^2$; and (2) a temperature of about 250° C. and a current density of about 17.8 mA/$\mu$m$^2$.

Broadly stated, the package-level stress testing allows for the calculation of kinetics parameters, namely the activation energy ($\Delta H$) and the current density exponent (n), in accordance with Black's equation:

$$\tau = A/J^n e^{\Delta H/kT};$$

wherein $\tau$ is the time to test structure failure;

A is Black's constant;

J is the applied current density;

k is Boltzmann's constant; and

T is temperature.

The determination of the kinetics parameters for the isothermal wafer-level tests is somewhat more difficult, since in that type of testing, temperature and applied current are not varied independently. However, the activation energy ($\Delta H$) for the wafer-level testing may be reliably obtained by determining the slope of a plot (derived from Black's equation) of $\ln[(\tau_{50})(J^n)]$ vs. $1/kT$, wherein $\tau_{50}$ represents the median time to failure for a given population distribution of wafer-level stressed structures. In such a plot, a value for n may be taken from the package-level test(s). Additional information on determining $\Delta H$ for the wafer-level testing may be found in Comparison of Via/Line Package Level Vs. Wafer Level Results, Deborah Tibel, et al., (IRPS Proceedings, 2001, p. 194–199), which is incorporated herein by reference.

After the kinetics parameters are obtained for both the package-level and the wafer-level tests, an acceleration factor between the two tests is determined to predict lifetime projections of the test structures. First, an experimental acceleration factor ($AF_{experimental}$) is calculated by simply taking the ratio of the lognormal $\tau_{50}$ values from the package-level and wafer-level tests:

$$AF_{experimental} = \tau_{50Pkg}/\tau_{50Waf}$$

Then, a calculated acceleration factor ($AF_{calculated}$) is the product of a calculated thermal acceleration ($T_{acc}$) and a calculated current density acceleration ($J_{accCalc}$), wherein:

$$J_{accCalc} = (j_{sWaf}/j_{sPkg})^n;$$

$$J_{accexperimental} = AF_{calc}/T_{acc};$$

$$T_{acc} = \exp\{(\Delta H/k)[1/T_{spkg} - 1/T_{sWaf}]\}$$

A comparison between the experimental and calculated acceleration factors has revealed good matching therebetween. Even though the stress conditions for the wafer-level tests are achieved by Joule heating of the test structure, the components in the calculated acceleration factor ($T_{acc}$ and $J_{accCalc}$) appear to be separable. In contrast to a normal stress situation, the current density is the greater of the two contributors to the overall acceleration from the package-level test to wafer-level test.

Through the implementation of the foregoing method 10 applied to test structure 100 (and underlying feed structure 140), electromigration lifetimes may be projected in times on the order of 100 seconds after an initial electromigration stress of about 48 hours is done. Thereby, the faster wafer-level testing may be used for more than just a good lot/bad lot determination, so long as an initial set of package-level testing is done for correlation purposes.

Notwithstanding the above described correlation methodology between package-level testing and isothermal wafer-level testing, additional useful information on EM failure mechanisms may be obtained by an analysis of the particular failure location(s) in the test structure. The physical failure mode for the wafer-level tests differs from that of the package-level tests. It has been discovered that, unless the applied stress current is below a certain level, the electromigration damage (i.e., void formation) tends to appear in the more central portions of a conventional test structure (as shown in FIG. 2). It is believed that this phenomenon is caused by excessive heating in the central portion of the line, thereby creating a thermal gradient between the stud and the central portion of the line. Thus, due to differences in aluminum diffusivity in regions of higher and lower temperature, a void will nucleate at that position where the combined effects of the thermal gradient and the absolute temperature create the greatest atomic flux divergence.

Specifically, it has been discovered that for the structure depicted in FIG. 2 and the underlying feed structure of FIG. 3, currents that produce temperatures in excess of about 220° C. will cause void formation away from the studs and toward the central portion of the elongated section. On the other hand, currents producing line temperatures below about 220° C. tend to cause void nucleation next to the stud. It is further believed that at temperatures below about 220° C., the tungsten stud material becomes hotter than the aluminum line because of its higher resistance and resultant greater local Joule heating, given the limited heat sinking capacity of the underlying feed structure. To a certain extent, this heating is also governed by the thermal conductance of the second line of wiring underneath the stud. For example, the greater the width of the second line of wiring, the greater the thermal conductance to the substrate thereunderneath. It stands to reason, therefore, changes in dielectric thickness or type, the width of the underlying tungsten connection or the number of vias used will each influence the temperature at the end of the line.

Figure 6:
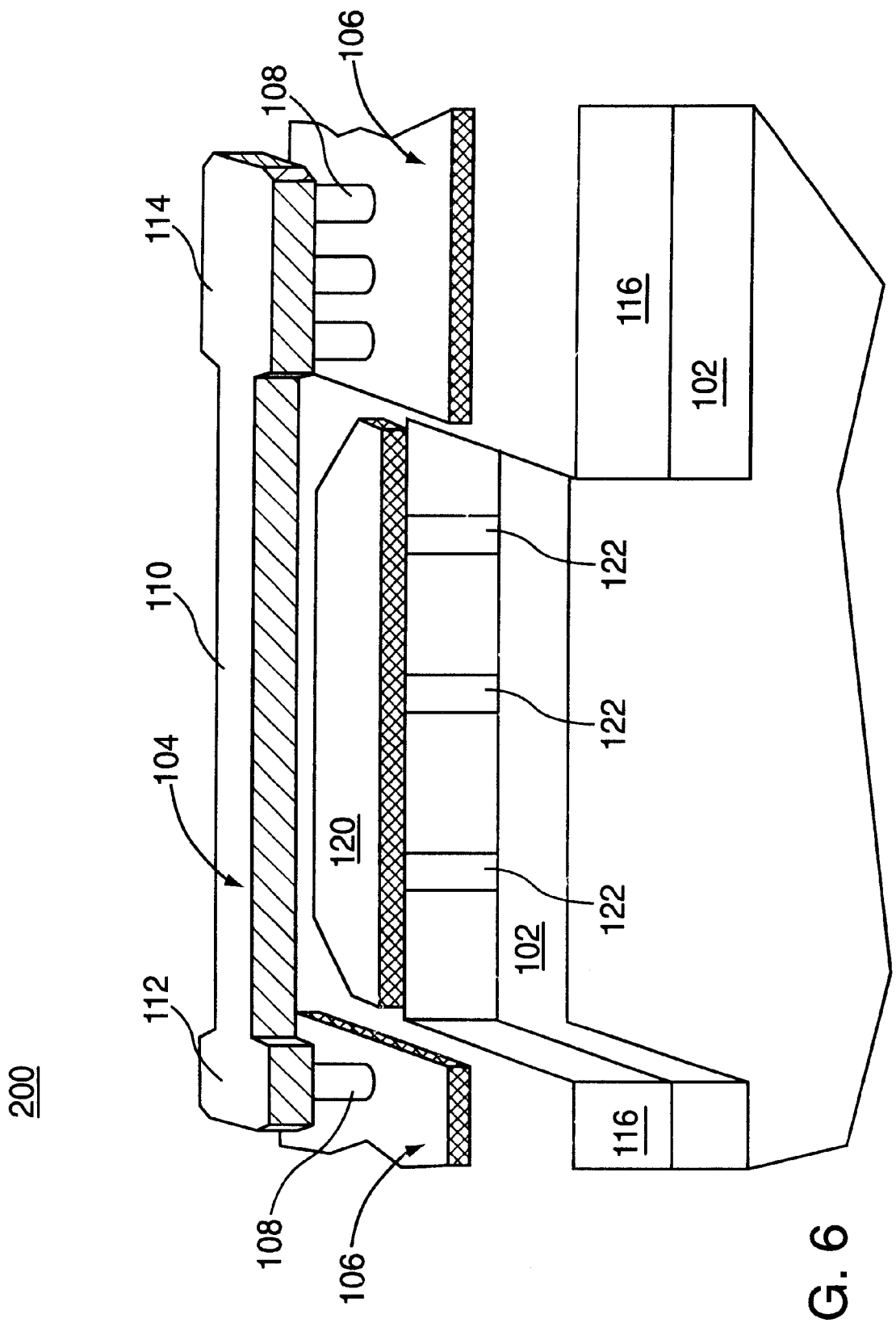
FIG. 6 is a perspective view of a novel test apparatus for determining the electromigration characteristics of a wiring structure in an integrated circuit device, in accordance with a further embodiment of the invention.

Accordingly, FIG. 6 illustrates an improved test apparatus 200 for determining the electromigration characteristics of a wiring structure in an integrated circuit device, in accordance with further embodiment of the invention. For ease of description, like numbered elements in the various figures are designated with like reference numerals.

In addition to the aforementioned first and second lines of wiring connected by studs, test apparatus 200 further includes a heat sink structure 120 which is capable of dissipating heat associated with the passage of electrical current through the first line 104 of wiring. In one embodiment, the heat sink structure 120 is made from a metal pad, preferably tungsten. Furthermore, in the embodiment shown, the heat sink structure 120 is located underneath the elongated section 110 of the first line of wiring, at the same metallization level as the second line of wiring. However, the heat sink structure 120 may alternatively be located anywhere adjacent the elongated section 110 and can have several shapes and configurations.

Optionally, the heat sink structure 120 may be directly thermally coupled with silicon substrate 102 through a series of vias or studs 122 formed through dielectric layer 116. It will be noted, however, that the heat sink structure 120 is electrically isolated from second line 106. In addition to being located underneath elongated section 110 of first line 104 of wiring, the heat sink structure 120 could alternatively be located above elongated section 110 on an upper level of wiring. Yet an alternative embodiment is to have an array of heat sink structures on successive metal layers, both above and below first line 104. In such a configuration, each individual heat sink structure could further be connected to one another (from level to level) through metallic studs 108.

Figure 7:
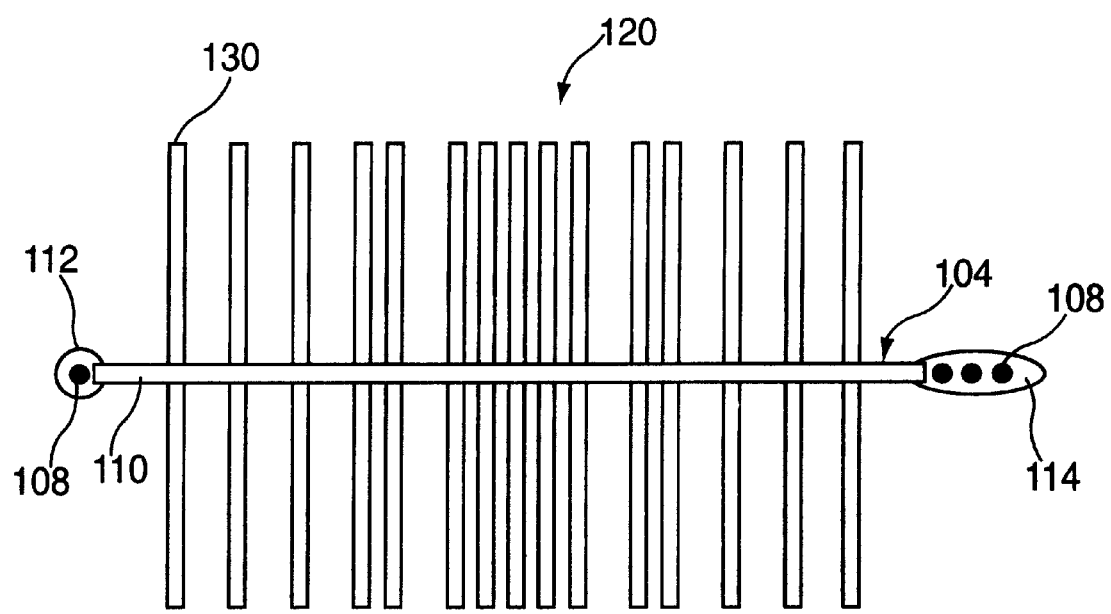
FIG. 7 is a top view of an alternative embodiment for the heat sink structure shown in FIG. 6.

Referring now to FIG. 7, there is shown a top view of still a further possible embodiment for the heat sink structure 120. Instead of a unitary metal plate, heat sink structure 120 may include a series of metal strips 130 running underneath (or above) first line 104. As shown, the strips 130 run generally perpendicular with respect to the axis of the elongated section 110, however a parallel configuration of strips 130 with respect to elongated section 110 is also contemplated. Furthermore, the strips may be spaced uniformly with respect to one another, or they may be spaced unevenly (as shown in FIG. 6) in order to achieve a desired thermal profile.

Finally, the thermal profile of first line 104 may also be adjusted, for example, by forming first and second ends 112, 114 with roughly an equivalent width as that of the elongated section 110. In addition, the studs 108 may be centrally located with respect to the connections with first and second ends 112, 114. Or, alternatively, the studs may be positioned in a staggered pattern or in an overlapping fashion with respect to the edges of first and second ends 112 and 114 such that a portion of the stud contacts the first line 104 and another portion contacts an insulating layer (not shown).

A heat sink structure or heat sink structures, thus configured, can be used to alter thermal gradients otherwise existing in the above described test structure types. In so doing, an improved correlation may be made between failure modes for wafer-level and package-level testing. Ultimately, the quicker, higher-stress tests can not only be used for individual lot quality determination, but also for the lifetime projections previously carried out with longer lasting stress conditions.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for determining the electromigration characteristics of a wiring structure in an integrated circuit device, the method comprising:

configuring a defined test structure type for said integrated circuit device, said defined test structure type further comprising:

a first line of wiring primarily disposed in a principal plane of a semiconductor substrate; and a second line of wiring connected to said first line of wiring, said second line of wiring disposed in a secondary plane which is substantially parallel to said principal plane;

said first and second lines of wiring being connected by a via structure therebetween;

determining a thermal coefficient of resistance in said first line of wiring and said via structure, said thermal coefficient of resistance characteristic of said defined structure type;

introducing a wafer-level stress condition in a first individual test structure of said defined test structure type, said wafer-level stress condition comprising an applied electrical stress over a first time period; and determining at least one parameter value for said first individual test structure, said at least one parameter value for said first individual test structure being used to predict a lifetime projection for the wiring structure in the integrated circuit device.

2. The method of claim 1, further comprising:

introducing a package-level stress condition in a second individual test structure of said defined test structure type, said package-level stress condition comprising an applied electrical stress over a second time period, said second time period being greater than said first time period;

determining at least one parameter value for said second individual test structure; and correlating said at least one parameter value determined for said second individual test structure with said at least one parameter value determined for said first individual test structure.

3. The method of claim 2, wherein:

said at least one parameter value determined for each of said first and second individual test structures comprises an activation energy ($\Delta H$) and a current density exponent (n), in accordance with the equation $$\tau = A/J^n e^{\Delta H/kT};$$

wherein $\tau$ is a time to test structure failure;

A is Black's constant;

J is an applied current density k is Boltzmann's constant; and

T is temperature.

4. The method of claim 3, wherein said correlating said at least one parameter value determined for said second individual test structure with said at least one parameter value determined for said first individual test structure further comprises:

determining an acceleration factor between said package-level stress condition introduced in said second individual test structure and said wafer-level stress condition introduced in said first individual test structure.

5. The method of claim 1, wherein said determining a thermal coefficient of resistance ($\beta$) in said first line of wiring and said via structure further comprises:

measuring a first resistance of said first line of wiring and said via structure at a first temperature;

measuring a second resistance of said first line of wiring and said via structure at a second temperature;

wherein $\beta$ is determined by the ratio between a change in resistance between said first resistance and second resistance divided by a change in temperature between said first temperature and said second temperature.

6. The method of claim 5, wherein said introducing a wafer-level stress condition in said first individual test structure further comprises:

selecting a target temperature for heating said first individual test structure thereto;

determining an initial current target value to be applied to said first individual test structure in order to generate said target temperature therein, said initial current target value being dependent upon $\beta$;

applying an incrementally increasing current to said first individual test structure until the value of said incrementally increasing current equals said initial current target value, then maintaining said initial current target value;

measuring a resistance of said first individual test structure, said resistance indicative of the actual temperature of said first individual test structure; and adjusting the applied current from said initial current target value if the measured value of said resistance indicates that the actual temperature of said first individual test structure has deviated from said target temperature;

wherein said wafer-level stress condition is completed when said resistance of said first individual test structure has increased to a predetermined failure value, with the time elapsed between achieving said initial current target value and reaching said predetermined failure value being recorded.

7. A test apparatus for determining the electromigration characteristics of a wiring structure in an integrated circuit device, comprising:

a first line of wiring disposed in a principal plane of a semiconductor substrate;

a second line of wiring connected to said first line of wiring, said second line of wiring disposed in a secondary plane which is substantially parallel to said principal plane; and a heat sink structure, located adjacent said first line of wiring, said heat sink structure capable of dissipating heat associated with passage of electrical current through said first line of wiring.

8. The test apparatus of claim 7, wherein said first line of wiring further comprises:

a first end connected to a second end through an elongated section therebetween;

said first end and said second end each having a width associated therewith which is greater than a width of said elongated section.

9. The test apparatus of claim 7, wherein said second line of wiring is connected to said first line of wiring at said first and second ends through metallic studs.

10. The test apparatus of claim 9, wherein a length of said second end is greater than a length of said first end.

11. The test apparatus of claim 7, wherein said heat sink structure further comprises a metal plate, said metal plate disposed between said first line of wiring and said semiconductor substrate.

12. The test apparatus of claim 11, wherein said metal plate is connected to said substrate through a plurality of metallic studs.

13. The test apparatus of claim 11, wherein said heat sink is dimensioned and located so as to assist in creating a thermal gradient around a selected region of said first line of wiring.

14. The test apparatus of claim 7, wherein said heat sink structure further comprises an array of metal lines, said array of metal lines disposed between said first line of wiring and said semiconductor substrate.

15. The test apparatus of claim 7, wherein said heat sink structure further comprises:

a plurality of individual metal plates, each of said plurality of individual metal plates being arranged in separate metallization layers with respect to said principal plane.

16. The test apparatus of claim 15, wherein:

one of said individual metal plates is connected to another of said individual metal plates or to said substrate through a plurality of metallic studs.

17. A semiconductor device, comprising:

an integrated circuit formed upon a semiconductor substrate; and a wiring reliability test structure formed upon said semiconductor substrate for determining the electromigration characteristics of wiring structures included in said integrated circuit, said test structure further comprising:

a first line of wiring disposed in a principal plane of said semiconductor substrate;

a second line of wiring connected to said first line of wiring, said second line of wiring disposed in a secondary plane which is substantially parallel to said principal plane; and a heat sink structure, located adjacent said first line of wiring, said heat sink structure capable of dissipating heat associated with passage of electrical current through said first line of wiring.

18. The semiconductor device of claim 17, wherein said first line of wiring further comprises:

a first end connected to a second end through an elongated section therebetween;

said first end and said second end each having a width associated therewith which is greater than a width of said elongated section.

19. The semiconductor device of claim 18, wherein said second line of wiring is connected to said first line of wiring at said first and second ends through metallic studs.

20. The semiconductor device of claim 19, wherein a length of said second end is greater than a length of said first end.

21. The semiconductor device of claim 17, wherein said heat sink structure further comprises a metal plate, said metal plate disposed between said first line of wiring and said semiconductor substrate.

22. The semiconductor device of claim 21, wherein said metal plate is connected to said substrate through a plurality of metallic studs.

23. The semiconductor device of claim 21, wherein said heat sink is dimensioned and located so as to assist in creating a thermal gradient around a selected region of said first line of wiring.

24. The semiconductor device of claim 17, wherein said heat sink structure further comprises an array of metal lines, said array of metal lines disposed between said first line of wiring and said semiconductor substrate.

25. The semiconductor device of claim 17, wherein said heat sink structure further comprises:

a plurality of individual metal plates, each of said plurality of individual metal plates being arranged in separate metallization layers with respect to said principal plane.

26. The semiconductor device of claim 25, wherein:

one of said individual metal plates is connected to another of said individual metal plates or to said substrate through a plurality of metallic studs.

* * * * *